United States Patent
Fukuda (12)

(10) Patent No.: US 6,215,157 B1
(45) Date of Patent: Apr. 10, 2001

(54) ELECTROSTATIC DISCHARGE PROTECTION CIRCUIT FOR A SEMICONDUCTOR INTEGRATED CIRCUIT AND LAYOUT THEREOF

(75) Inventor: Takeshi Fukuda, Kanagawa (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/365,168

(22) Filed: Aug. 2, 1999

(30) Foreign Application Priority Data

Jul. 31, 1998 (JP) .................................................. 10-216928

(51) Int. Cl.⁷ .................................................. H01L 23/62
(52) U.S. Cl. ........................... 257/362; 257/355; 257/356
(58) Field of Search .................................. 257/355, 356, 257/360, 362

(56) References Cited

U.S. PATENT DOCUMENTS

| | | | |
|---|---|---|---|
| 5,936,282 | * | 8/1999 | Baba et al. ............................. 257/355 |
| 5,949,109 | * | 9/1999 | Shimizu et al. ....................... 257/355 |
| 6,016,002 | * | 1/2000 | Chen et al. ............................ 257/546 |

FOREIGN PATENT DOCUMENTS

| | | |
|---|---|---|
| 62-188363 | 8/1987 | (JP) . |
| 2-28362 | 1/1990 | (JP) . |
| 4-48773 | 2/1992 | (JP) . |
| 4-259251 | 9/1992 | (JP) . |
| 4-335570 | 11/1992 | (JP) . |
| 6-77273 | 3/1994 | (JP) . |
| 9-191080 | 7/1997 | (JP) . |

* cited by examiner

Primary Examiner—Ngan V. Ngo
(74) Attorney, Agent, or Firm—Young & Thompson

(57) ABSTRACT

In accordance with the present invention, a semiconductor integrated circuit comprises an internal circuit, an output driver circuit connected to the internal circuit for amplifying an output signal from the output driver circuit to output an amplified output signal, at least a first electrode pad connected to the output driver circuit for receipt of the amplified output signal from the output driver circuit, a first ground line connected to the internal circuit for supplying a ground potential to the internal circuit and a second ground line connected to the output driver circuit for supplying the ground potential to the output driver circuit, wherein at least an electrostatic discharge protection circuit is provided between the first electrode pad and the second ground line.

10 Claims, 11 Drawing Sheets

ELECTROSTATIC DISCHARGE PROTECTION CIRCUIT FOR A SEMICONDUCTOR INTEGRATED CIRCUIT AND LAYOUT THEREOF

BACKGROUND OF THE INVENTION

The present invention relates to an electrostatic discharge protection circuit for a semiconductor integrated circuit such as a semiconductor memory device as well as a layout of the electrostatic discharge protection circuit.

The semiconductor integrated circuit such as dynamic random access memory device has a substrate potential which remains biased at the ground potential or a minus potential, wherein a bias line is used as a ground line for an internal circuit. This ground line extends through a semiconductor pellet or along an external shape of the pellet. This ground line is connected through the electrostatic discharge protection circuit to electrode pads. This ground line is also used as a common discharge line for application of an electrostatic voltage. Such conventional semiconductor integrated circuit is, for example, disclosed in Japanese laid-open patent publication No. 7-86510.

In recent years, scaling down of the semiconductor devices as integrated and an increase in integration of the semiconductor integrated circuit have been progressed. In advanced dynamic random access memory such as 64M-bits dynamic random access memory, the semiconductor substrate has three-layered wells and the substrate potential is fixed at the ground level. The conventional circuit configuration of the dynamic random access memory will be described. FIG. 1 is a circuit diagram illustrative of a conventional circuit configuration including the electrostatic discharge protection circuit. A ground pad 101 is provided which is connected with a ground line 7. The ground potential is given to the ground pad 101 by contacting a pin to the ground pad 101 externally. Electrode pads 102, 103, 104 and 105 are also provided which are connected to electrostatic discharge protection circuits. Those electrostatic discharge protection circuits are also connected to the ground line 7. Those electrostatic discharge protection circuits are also provided between the electrode pads 102, 103, 104 and 105 and the ground line 7. Each of the electrostatic discharge protection circuits comprises a diode 2 and a voltage clamping device 3. This electrostatic discharge protection circuit is operated as follows.

If an electrostatic voltage which is higher in potential than the ground pad 101 is applied to the electrode pad 104, then the voltage claming device 3 is made conductive to allow discharge from the ground pad 101. If an electrostatic voltage which is lower in potential than the ground pad 101 is applied to the electrode pad 104, then the diode 2 is made conductive to allow discharge from the ground pad 101. The ground line 7 serves as a common discharge line.

The pad 103 serves as a signal input/output pad. This signal input/output pad is also connected to an n-channel output MOS field effect transistor 5 and a p-channel output MOS field effect transistor 6. The n-channel output MOS field effect transistor 5 and the p-channel output MOS field effect transistor 6 form an inverter which serves as an output driving circuit (output buffer). An output signal from the semiconductor integrated circuit is inputted into gates of the n-channel output MOS field effect transistor 5 and the p-channel output MOS field effect transistor 6, and further this signal is amplified and supplied to the signal input/output pad 103. An input signal is applied to the signal input/output pad 103 and then transmitted through an input signal line represented by an arrow mark.

The above output transistor has a large driving ability as being used for a signal amplification. A plurality of the output transistors are concurrently driven. If the plural output transistors are also connected to the single ground line 7, then an internal circuit is influenced in power voltage or power potential. In order to avoid this influence to power voltage or power potential, it is generally adopted that a power is supplied to the output transistors separately from the internal circuit, for which reason separately from the ground pad 101 and the power voltage pad 104 for supplying the ground potential and the power voltage to the internal circuit, there are additionally provided an additional ground potential pad 102 and an additional power potential pad 105 for supplying the ground potential and the power voltage to the output transistors. The n-channel output transistors 5 are connected through a ground potential supply line 8 to the additional ground potential pad 102. The p-channel output transistors 6 are connected through a power voltage supply line 33 to the additional power potential pad 105.

FIG. 2 is a fragmentary plane view illustrative of a layout of a circuit block 4' which is connected to the input/output pad 103 in FIG. 1, wherein the circuit block 4' includes the input/output pad 103, the diode 2, the voltage clamping device 3, and the n-channel output transistor 105. FIG. 3 is a fragmentary cross sectional elevation view illustrative of a circuit block 4' taken along a B–B' line of FIG. 3.

As described above, the semiconductor device has a three-layered well structure over a p-type semiconductor substrate 25. An n-type well 10 is formed in the p-type semiconductor substrate 25. Further, p-type wells 91 and 92 are formed in the n-type well 10 so that the p-type wells 91 and 92 are separated from each other. In the p-type well 91, n-type diffusion layers 11 are selectively formed. The n-type diffusion layers 11 are defined by field oxide films 26. In the n-type diffusion layers 11, there are formed the diode 2 for the electrostatic discharge protection circuit and the voltage clamping device 3. In the p-type well 91, a guard ring 161 is further provided as a well contact for biasing the well. This guard ring 161 comprises a p+-type diffusion layer. This guard ring 161 is connected through a contact 23, a tungsten line 15, and a contact 35 to the ground line 7. The diode 2 is formed between the p-type diffusion layer unitary formed with the guard ring 161 and the n-type diffusion layer 11. The guard ring 161 serves as an anode whilst the n-type diffusion layer 11 serves as a cathode. The voltage claming device 3 may be considered to be a bipolar transistor. Adjacent two of the n-type diffusion layers 11 separated from each other by the field oxide film 26 serve as an emitter and a collector of the bipolar transistor and the p-type well 91 serves as a base.

In the p-well 92, an n-channel output transistor 5 is formed which comprises an n-type diffusion layer 12 and a gate electrode 13. A source of the output transistor 5 is connected through a contact 24, a tungsten line 34 and a contact 22 to the ground potential supply line 8. A drain of the output transistor 5 is connected through a contact 21, a tungsten line 14 and a contact 19 to the input/output pad 103. In this well 92, a guard ring 162 is formed which comprises a p+-type diffusion layer. This guard ring 162 is connected to the ground potential supply line 8.

An n-well contact 17 is formed to bias the n-well 10. This n-well contact 17 is also connected to a DVV line. A p-type substrate contact 18 is also formed in the p-type substrate 25. Those substrate contact and the well contacts are provided in order to prevent that carriers generated in an electrostatic voltage application are transmitted through the substrate to break a gate oxide film and a pan junction existing in the peripheral region.

FIG. 4 is a plane view illustrative of a conventional semiconductor pellet. A pellet 32 has a memory block 29 and a peripheral circuit 31. The memory block 29 includes memory cell arrays, address decoders and sense amplifiers. We peripheral circuit 31 includes a voltage-rising circuit or a boosting circuit and a voltage-falling circuit for a power supply, a data amplifier and fuse circuits for redundancy circuits. In those internal circuits, interconnections extend from the ground lines 7 and 30 for supplying the ground potential.

In the conventional dynamic random access memory having a small input/output but number up to 16 bits, the input/output pads 103 are locally arranged in an upper half region of the pellet 32, for which reason the circuit block 4' comprising the output transistor 5, the diode 2 and the voltage clamping device 3 is also formed in the upper half region of the pellet 32. The ground potential supply line 8 for the output transistor 5 is also formed in the upper half region of the pellet 32. Although an illustration is omitted, electrostatic discharge protection circuits are also provided for pads arranged in a lower half region of the pellet 32. Since it is required that a common discharge line is provided for all of the electrostatic discharge protection circuits, the ground line 7 for the internal circuit is used as a common discharge line. Arrangements of the pads over the pellet are decided in accordance with JEDEC Joint Electron Device Engineering Council. Recently, for the dynamic random access memory of 32-bits as input/output bits, arrangements of the pads were decided by JBDEC, where input/output pads are arranged in upper and lower parts of the pellet.

Since the ground line is used as the common discharge line, the layout of the circuit block 4' is as illustrated in 2 and 3. In order to avoid transmission of voltage variation of the ground potential supply line to the ground line 7, it is necessary to form the p-wells 91 and 92 separately from each other. This separate formations of the p-wells 91 and 92 causes enlargement in occupied area of the circuit block 4', whereby a distance between the memory blocks is also widen. This causes an enlargement in chip size of the semiconductor integrated circuit.

In the above circumstances, it had been required to develop a novel electrostatic discharge protection circuit for a semiconductor integrated circuit such as a semiconductor memory device as well as a layout of the electrostatic discharge protection circuit free from the above problem.

SUMMARY OF THE INVENTION

Accordingly, it is an object of the present invention to provide a novel an electrostatic discharge protection circuit for a semiconductor integrated circuit such as a semiconductor memory device as well as a layout of the electrostatic discharge protection circuit free from the above problems.

In accordance with the present invention, a semiconductor integrated circuit comprises an internal circuit, an output driver circuit connected to the internal circuit for amplifying an output signal from the output driver circuit to output an amplified output signal, at least a first electrode pad connected to the output driver circuit for receipt of the amplified output signal from the output driver circuit, a first ground line connected to the internal circuit for supplying a ground potential to the internal circuit and a second ground line connected to the output driver circuit for supplying the ground potential to the output driver circuit, wherein at least an electrostatic discharge protection circuit is provided between the first electrode pad and the second ground line.

The above and other objects, features and advantages of the present invention will be apparent from the following descriptions.

BRIEF DESCRIPTION OF THE DRAWINGS

Preferred embodiments according to the present invention win be described in detail with reference to the accompanying drawings.

DISCLOSURE OF THE INVENTION

Figure 1:
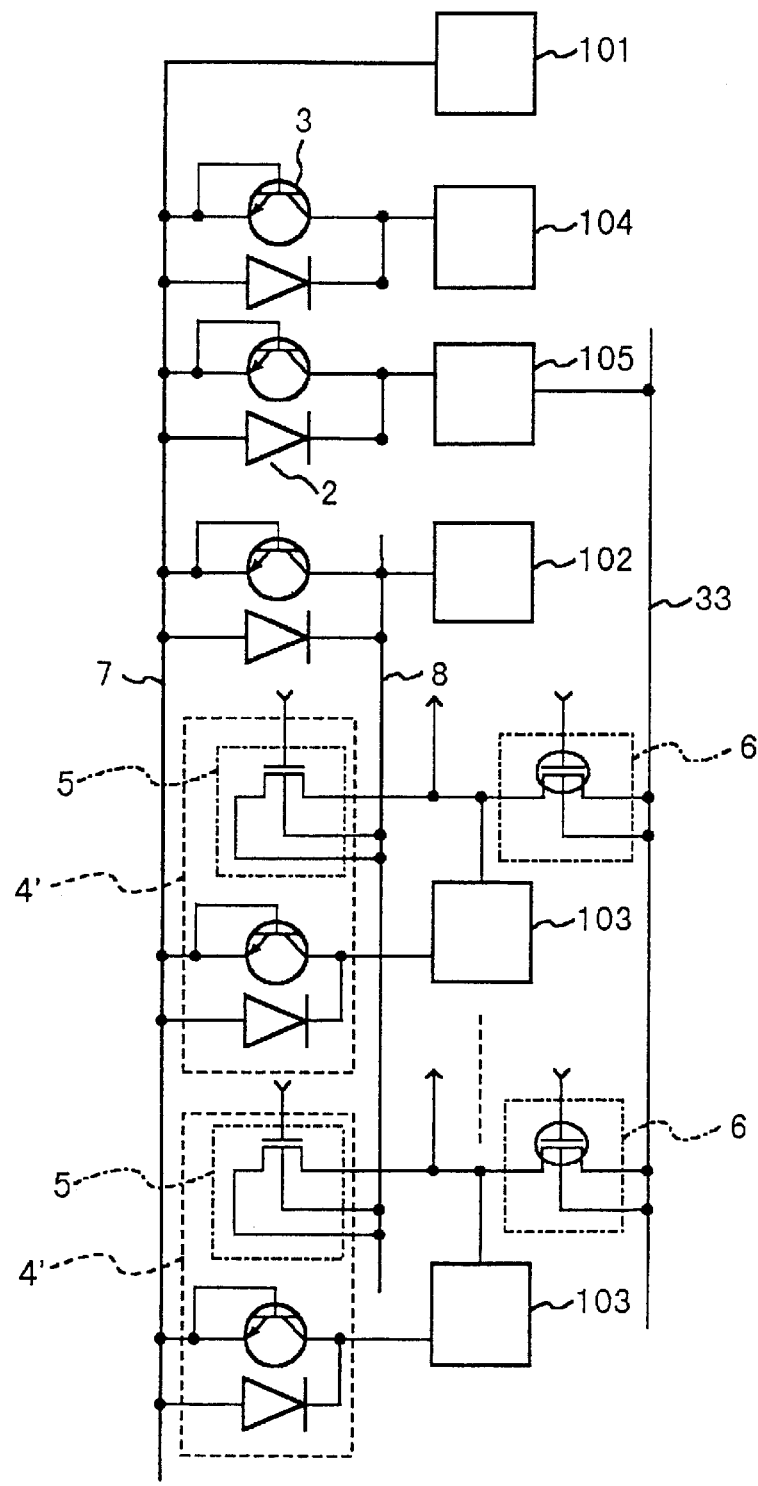
FIG. 1 is a circuit diagram illustrative of a conventional circuit configuration including the electrostatic discharge protection circuit.
Figure 2:
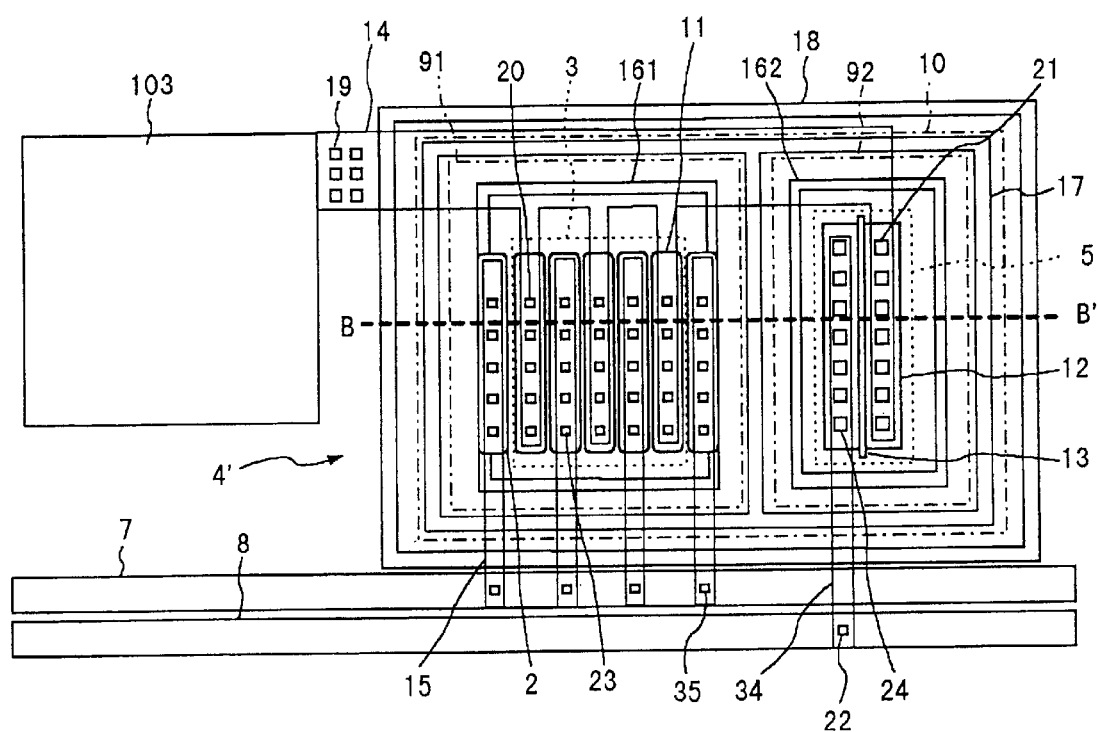
FIG. 2 is a fragmentary plane view illustrative of a layout of a circuit block which is connected to the input/output pad in FIG. 1.

In the prior art, the ground potential supply lines for supplying the ground potential to the input/output pads provided at upper and lower parts of the semiconductor pellet are formed at upper and lower parts of the semiconductor pellet, so that the ground potential supply lines extend along the input/output pads. In contrast, in accordances with the present invention, a common ground potential supply line is formed extending through both the upper and lower regions of the semiconductor pellet. Namely, the common ground potential supply line extends through the pellet so that the common ground potential supply line serves as a common discharge line for all of the pads.

In accordance with the present invention, a semiconductor integrated circuit comprises an internal circuit, an output driver circuit connected to the internal circuit for amplifying an output signal from the output driver circuit to output an amplified output signal, at least a first electrode pad connected to the output driver circuit for receipt of the amplified output signal from the output driver circuit, a first ground line connected to the internal circuit for supplying a ground potential to the internal circuit and a second ground line connected to the output driver circuit for supplying the ground potential to the output driver circuit, wherein at least an electrostatic discharge protection circuit is provided between the first electrode pad and the second ground line.

It is preferable to further comprise at least a second electrode pad connected to the first ground line for supplying the ground potential to the first ground line, at least a third electrode pad connected to the internal circuit, at least a second electrostatic discharge protection circuit connected to the second electrode pad, and at least a third electrostatic discharge protection circuit, wherein the second and third electrostatic discharge protection circuits are commonly connected to the second ground line.

It is preferable that the first and second ground lines are provided independently from each other.

In accordance with the present invention, a semiconductor integrated circuit having a first well region of a first conductivity type and a second well region of a second conductivity type formed in the first well region, wherein at least an electrostatic discharge protection circuit and at least an output driver circuit are formed in the second well region.

It is preferable that the electrostatic discharge protection circuit comprises at least a second conductivity type diffusion layer and a plurality of first conductivity type diffusion layers.

It is also preferable that the electrostatic discharge protection circuit comprises a first impurity doped diffusion region of a second conductivity type, a second impurity doped diffusion region of a first conductivity type, and a third impurity doped diffusion region of the first conductivity type, and the output driver circuit comprises a transistor which further comprises source drain regions of the first conductivity type and a gate electrode over the second well region between the source region and the drain region. It is further preferable that a first ground line and a first electrode pad are farther provided, and the second impurity doped diffusion region is provided adjacent to the first impurity doped diffusion region, and the third impurity doped diffusion region is provided adjacent to the second impurity doped diffusion region, and the first impurity doped diffusion region, the third impurity doped diffusion region and one of the source and drain diffusion regions are connected to the first ground line whilst the second impurity doped diffusion region and another of the source and drain diffusion regions are connected to the first electrode pad. It is furthermore preferable that the first and third impurity doped diffusion regions are positioned in the second well region and closer to the first electrode pad than the output driver circuit.

It is also preferable that a first well contact of a second conductivity type is positioned in the second well region and also extends along an external shape of the second well region and the first well contact is united with the first impurity doped diffusion region.

A semiconductor integrated circuit comprising a rectangular-shaped pellet which further comprises first and second half regions, wherein a first internal circuit is provided in the first half region, a second internal circuit is provided in the second half region, at least a single alignment of electrode pads is provided between the first and second internal circuits, a first ground line extends along the alignment of the electrode pads for supplying a ground potential to the first and second internal circuits, a second ground line extends along the alignment of the electrode pads and also extends between opposite ends of the alignment of the electrode pads and also is electrically separated from the first ground line, and a plurality of electrostatic discharge protection circuits are provided for individuals of plural electrode pads, and the electrostatic discharge protection circuits are commonly connected to the second ground line.

The electrostatic discharge protection circuit and the output driver circuit are supplied with the same ground level potential. This allows a reduction in area of layouts of circuits around the input/output pads, whereby a chip size of the semiconductor integrated circuit can be reduced.

Figure 5:
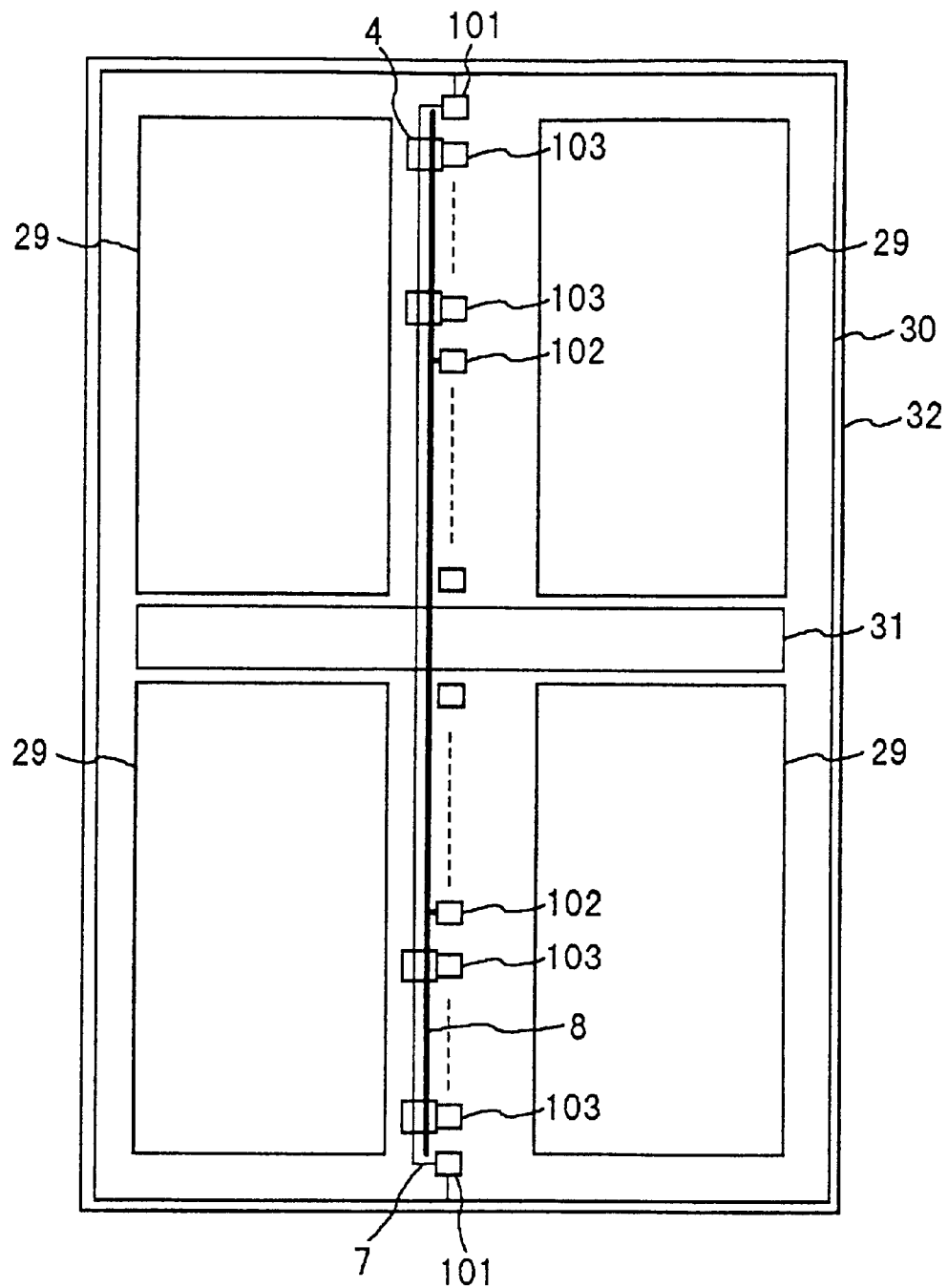
FIG. 5 is a plane view illustrative of a semiconductor pellet in a preferred embodiment in accordance with the present invention.

A preferred embodiment according to the present invention will be described in detail with reference to the drawings. FIG. 5 is a plane view illustrative of a semiconductor pellet in a preferred embodiment in accordance with the present invention. First and second alignments of input/output pads 103 are respectively provided in one side region and an opposite side region of a pellet 32. A ground line 8 is provided which extends along the first and second alignments of input/output pads 103 and through the pellet 32 for supplying a ground potential to the input/output pads 103. Ground lines 7 and 30 are provided for supplying the ground potential to a memory block 29 and a peripheral circuit 31. Although an illustration is omitted, the peripheral circuit is also provided between adjacent two of the memory blocks arranged in opposite sides of the ground line 8. The ground line 7 is supplied with the ground potential from the ground pad 101. The ground line 8 is supplied from the pad 102 with the same ground potential as being supplied to the ground pad 101.

Figure 6:
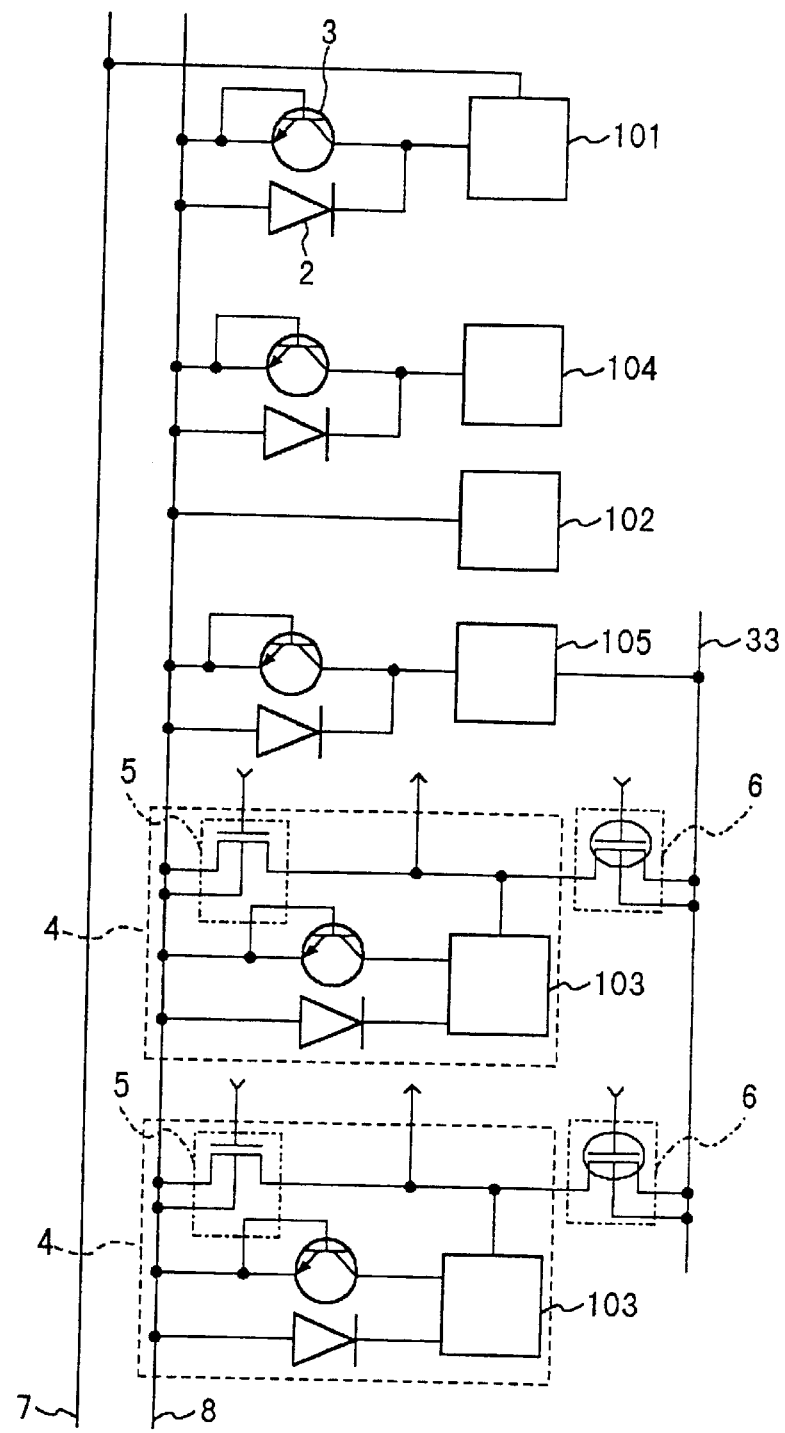
FIG. 6 is a circuit diagram illustrative of a novel circuit configuration including the electrostatic discharge protection circuit.

FIG. 6 is a circuit diagram illustrative of a novel circuit configuration including the electrostatic discharge protection circuit. Each of the electrostatic discharge protection circuits comprises a diode 2 and a voltage clamping circuit 3. The diodes 2 and the voltage clamping circuits 3 are connected to the ground line 8. The n-channel output transistor 5 is also connected to the ground line 8. In the prior art, the electrostatic discharge protection circuit is provided for the ground pad 102. In accordance with the present invention, however, no electrostatic discharge protection circuit is provided for the ground pad 102, but an electrostatic discharge protection circuit is provided for the ground pad 101.

Figure 7:
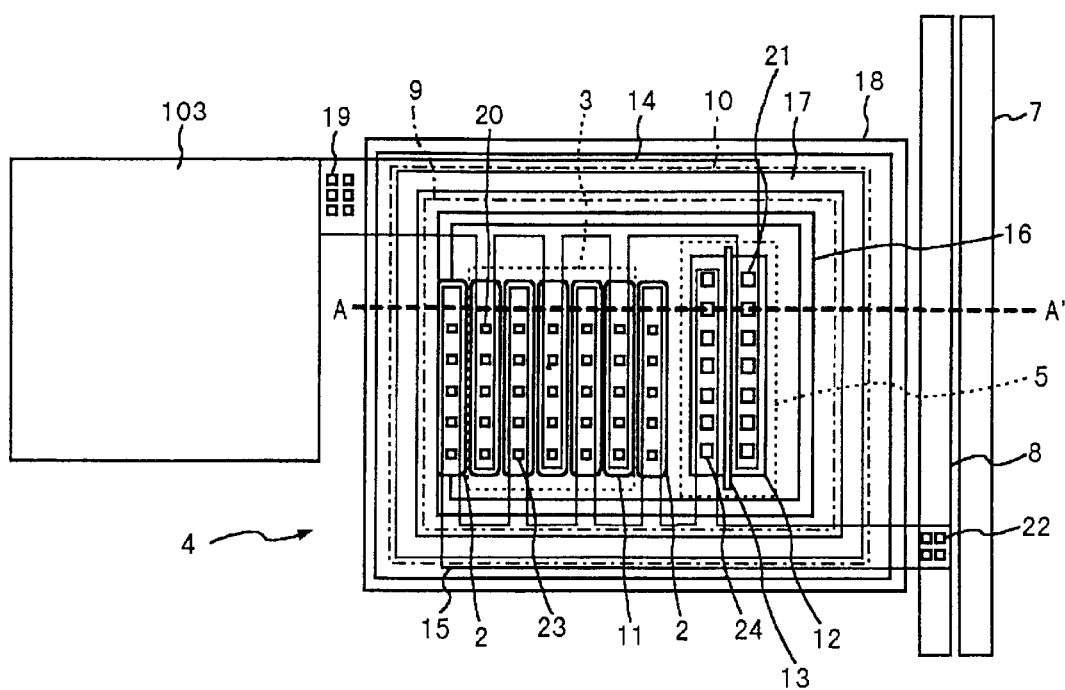
FIG. 7 is a fragmentary plane view illustrative of a layout of a circuit block which is connected to the input/output pad in FIG. 6.
Figure 8:
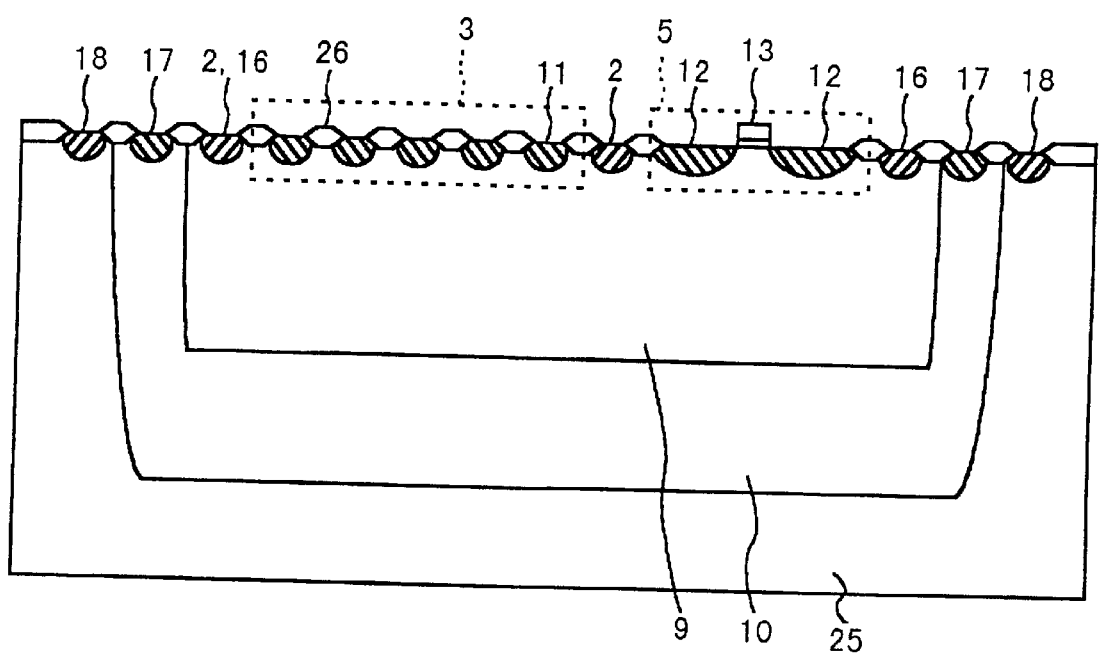
FIG. 8 is a fragmentary cross sectional elevation view illustrative of a circuit block taken along an A–A' line of FIG. 7.

FIG. 7 is a fragmentary plane view illustrative of a layout of a circuit block 4' which is connected to the input/output pad 103 in FIG. 6, wherein the circuit block 4' includes the input/output pad 103, the diode 2, the voltage clamping device 3, and the n-channel output transistor 5. FIG. 8 is a fragmentary cross sectional elevation view illustrative of a circuit block 4' taken along an A–A' line of FIG. 7.

As described above, the semiconductor device has a three-layered well structure over a p-type semiconductor substrate 25. An n-type well 10 is formed in the p-type semiconductor substrate 25. Further, a p-type well 9 is formed in the n-type well 10. In the p-type well 9, the diode 2, the voltage clamping device 3 and the n-channel output transistor 5 are also formed. The diode 2 and the voltage clamping device 3 forming the electrostatic discharge protection circuit should be connected to the common discharge line. In this preferred embodiment, the ground line 8 serves as a common discharge line, for which reason the electrostatic discharge protection circuit and the n-channel output transistor S are formed in the common well, whereby a single p-type well contact 16 is formed for biasing the p-well 9.

Figure 3:
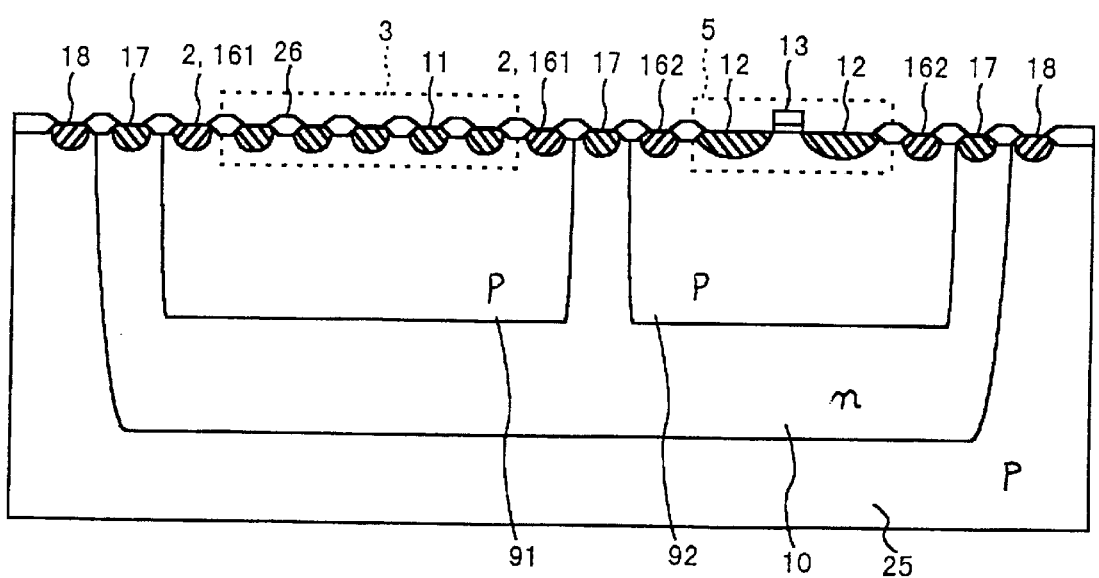
FIG. 3 is a fragmentary cross sectional elevation view illustrative of a circuit block 4' taken along a B–B' line of FIG. 3.
Figure 4:
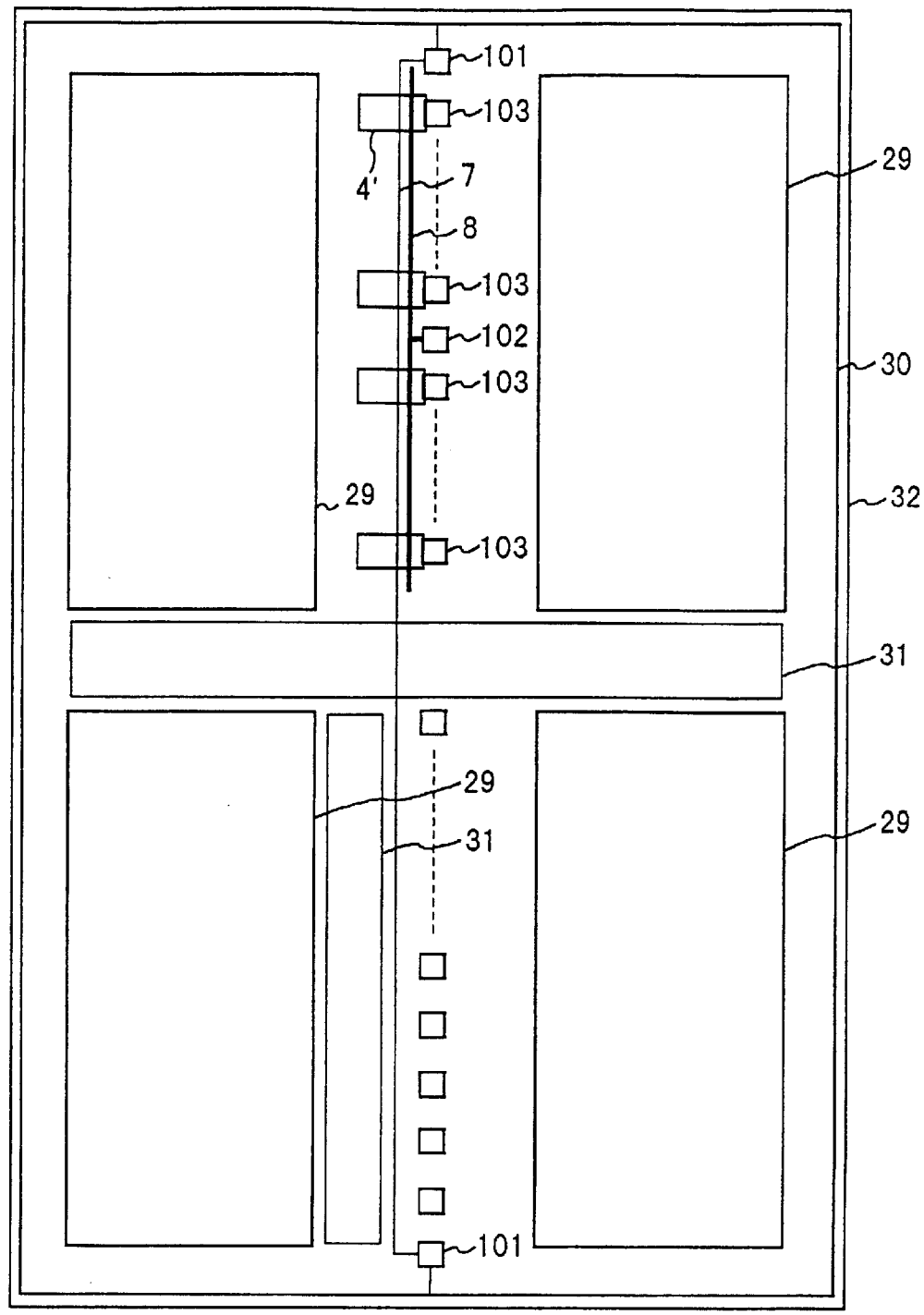
FIG. 4 is a plane view illustrative of a conventional semiconductor pellet.

In accordance with the present invention, it is possible to omit the n-well region 10 between the p-well regions 91 and 92, p-well contacts 161 and 162 around the same and the n-well contact 17 and further a field oxide film 26 between them in FIG. 3. It is, therefore, possible to reduce the area of the n-well region 10.

For the voltage clamping device 3, a distance between adjacent two of the n-type diffusion layers 11 is adopted so that the voltage clamping device turns ON with a lower voltage than a withstand voltage of a gate oxide film of the n-channel output transistor. A preferable distance between adjacent two of the n-type diffusion layers 11 is, for example, about 1 micrometer. Further, the electrostatic discharge protection circuit is positioned closer to the input/output pad 03 than the n-channel output transistor 5, so as to allow the voltage clamping device 3 to exhibit high speed operation upon the electrostatic voltage application.

Figure 9:
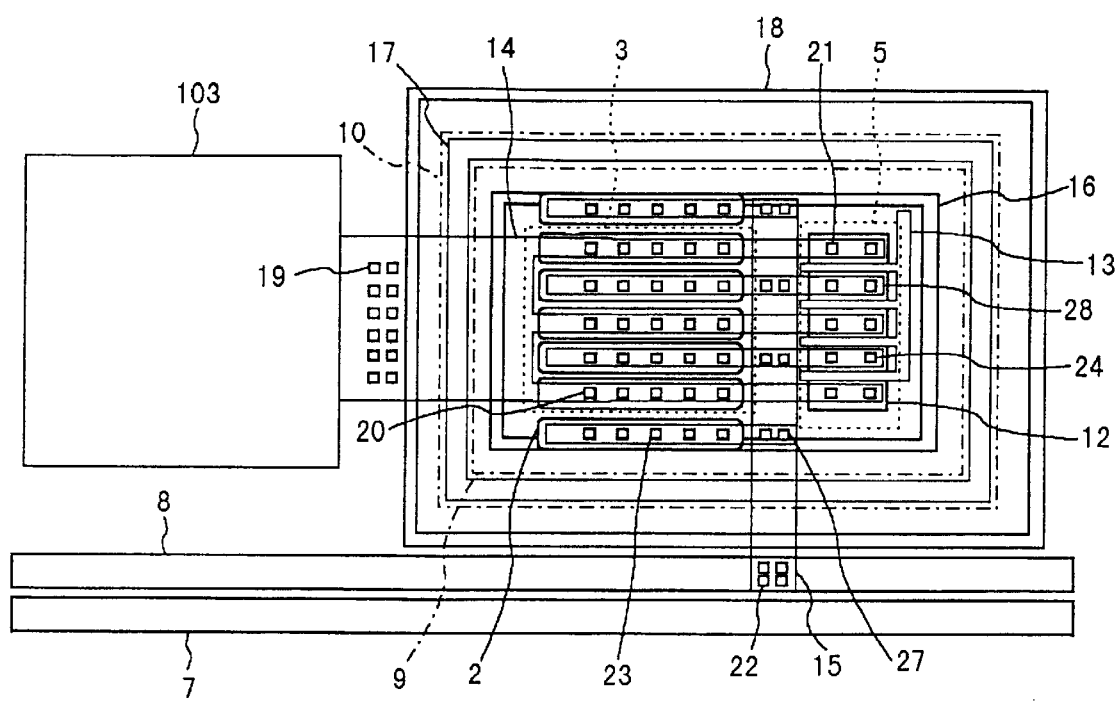
FIG. 9 is a fragmentary plane view illustrative of another layout of a circuit block which is connected to the input/output pad in FIG. 6.
Figure 10:
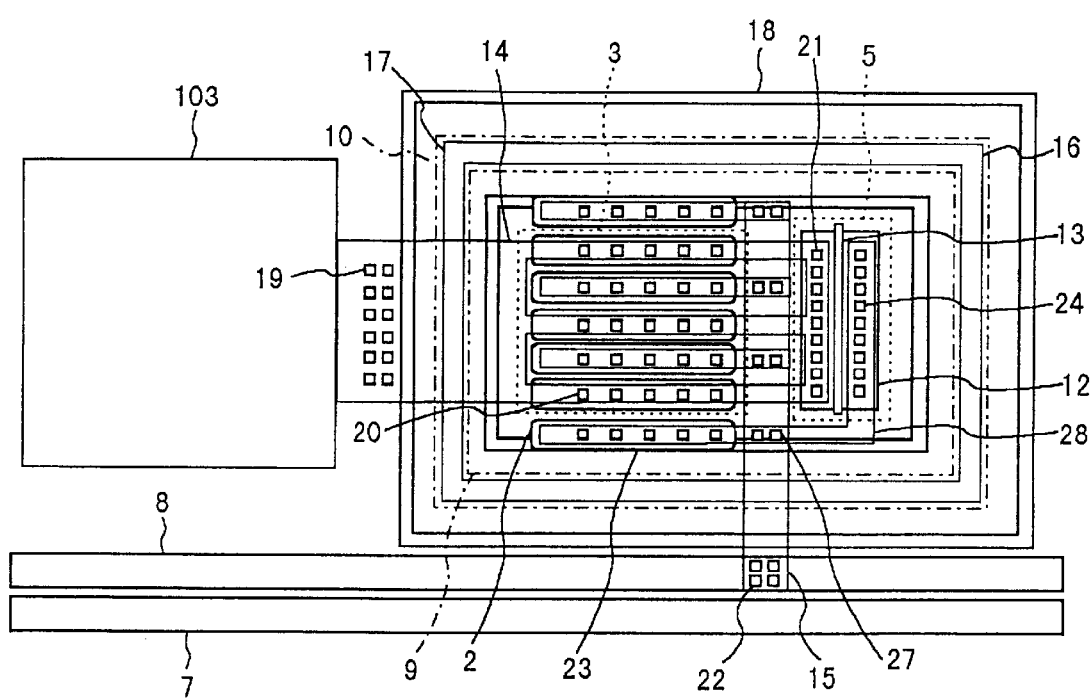
FIG. 10 is a fragmentary plane view illustrative of another layout of a circuit block which is connected to the input/output pad in FIG. 6.

It is possible to modify the electrostatic discharge protection circuit or the n-channel output transistor as illustrated in FIGS. 9 and 10. FIG. 9 is a fragmentary plane view illustrative of another layout of a circuit block 4' which is connected to the input/output pad 103 in FIG. 6, wherein the voltage clamping device 3 and the n-channel output transistor 5 are arranged to be directed in parallel direction to-the ground line 8. FIG. 10 is a fragmentary plane view illustrative of another layout of a circuit block 4' which is connected to the input/output pad 103 in FIG. 6, wherein the voltage clamping device 3 is arranged to be directed in lateral direction whilst the n-channel output transistor 5 is arranged to be directed in vertical direction to the ground line 8. Those layouts are optionally adopted in accordance with positional relationships of the ground line 8 and the input/output pads 103.

Figure 11:
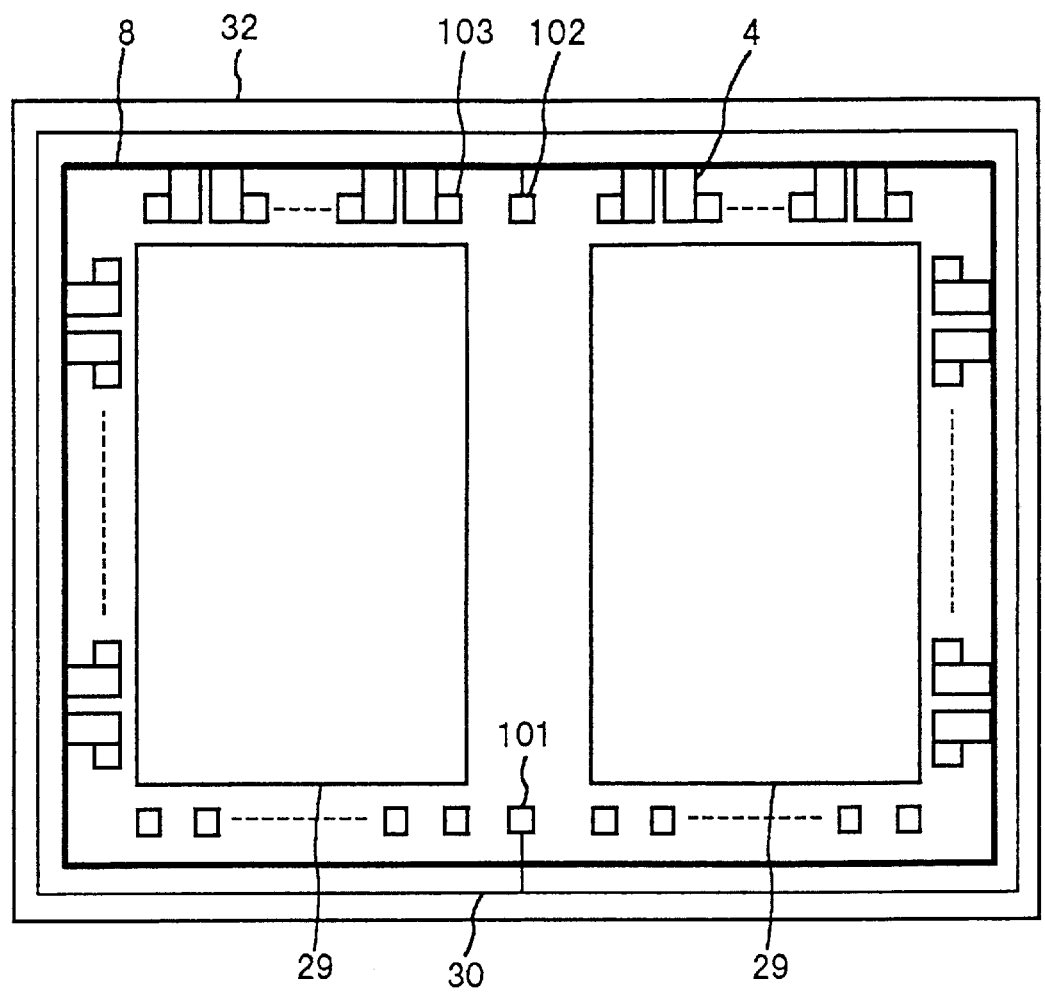
FIG. 11 is a plane view illustrative of a semiconductor pellet in another preferred embodiment in accordance with the present invention

FIG. 11 is a plane view illustrative of a semiconductor pellet in another preferred embodiment in accordance with the present invention, wherein alignments of pads extend along four sides of the rectangular shaped pellet and the single ground line 8 extend along four side peripheral region, so that the single ground line 8 serves as a common discharge line of the electrostatic discharge protection circuits 4, whereby the area of the circuit block 4' is reduced.

The size of the circuit block 4 as the circuits around the input/output pads 103 is reduced by about 50–100 micrometers from the conventional one. If the present invention is applied to the center-pad type pellet as illustrated in FIG. 5, it is possible to reduce the distance between the adjacent two of the memory blocks in the parallel direction to the ground line 8. If the present invention is applied to the peripheral-pad type pellet as illustrated in FIG. 11, it is possible to reduce the size of the pellet in both parallel and vertical direction to the ground line 8.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A semiconductor integrated circuit comprising:
    an internal circuit, an output driver circuit connected to the internal circuit for amplifying an output signal from the output driver circuit to output an amplified output signal;
    at least a first electrode pad connected to the output driver circuit for receipt of the amplified output signal from the output driver circuit;
    a first ground line connected to the internal circuit for supplying a ground potential to the internal circuit; and
    a second ground line connected to the output driver circuit for supplying the ground potential to the output driver circuit,
    wherein at least an electrostatic discharge protection circuit is provided between the first electrode pad and the second ground line.

2. The semiconductor integrated circuit as claimed in claim 1, further comprising:
    at least a second electrode pad connected to the first ground line for supplying the ground potential to the first ground line;
    at least a third electrode pad connected to the internal circuit, at least a second electrostatic discharge protection circuit connected to the second electrode pad; and
    at least a third electrostatic discharge protection circuit,
    wherein the second and third electrostatic discharge protection circuits are commonly connected to the second ground line.

3. The semiconductor integrated circuit as claimed in claim 1, wherein the first and second ground lines are provided independently from each other.

4. A semiconductor integrated circuit having a first well region of a first conductivity type and a second well region of a second conductivity type formed in the first well region,
    wherein at least an electrostatic discharge protection circuit and at least an output driver circuit are formed in the second well region.

5. The semiconductor integrated circuit as claimed in claim 4, wherein the electrostatic discharge protection circuit comprises at least a second conductivity type diffusion layer and a plurality of first conductivity type diffusion layers.

6. The semiconductor integrated circuit as claimed in claim 4, wherein the electrostatic discharge protection circuit comprises:
    a first impurity doped diffusion region of a second conductivity type;
    a second impurity doped diffusion region of a first conductivity type; and
    a third impurity doped diffusion region of the first conductivity type, and
    wherein the output driver circuit comprises:
        a transistor which further comprises source drain regions of the first conductivity type and a gate electrode over the second well region between the source region and the drain region.

7. The semiconductor integrated circuit as claimed in claim 6, wherein a first ground line and a first electrode pad are further provided, and the second impurity doped diffusion region is provided adjacent to the first impurity doped diffusion region, and the third impurity doped diffusion region is provided adjacent to the second impurity doped diffusion region, and the first impurity doped diffusion region, the third impurity doped diffusion region and one of the source and drain diffusion regions are connected to the first ground line whilst the second impurity doped diffusion region and another of the source and drain diffusion regions are connected to the first electrode pad.

8. The semiconductor integrated circuit as claimed in claim 6, wherein the first and third impurity doped diffusion regions are positioned in the second well region and closer to the first electrode pad than the output driver circuit.

9. The semiconductor integrated circuit as claimed in claim 6, wherein a first well contact of a second conductivity type is positioned in the second well region and also extends along an external shape of the second well region and the first well contact is united with the first impurity doped diffusion region.

10. A semiconductor integrated circuit comprising a rectangular-shaped pellet which further comprises: first and second half regions,
    wherein a first internal circuit is provided in the first half region, a second internal circuit is provided in the second half region, at least a single alignment of electrode pads is provided between the first and second internal circuits, a first ground line extends along the alignment of the electrode pads for supplying a ground potential to the first and second internal circuits, a second ground line extends along the alignment of the electrode pads and also extends between opposite ends of the alignment of the electrode pads and also is electrically separated from the first ground line, and a plurality of electrostatic discharge protection circuits are provided for individuals of plural electrode pads, and the electrostatic discharge protection circuits are commonly connected to the second ground line.

* * * * *